(12) United States Patent
Hilsenbeck et al.

(10) Patent No.: US 9,685,347 B2
(45) Date of Patent: *Jun. 20, 2017

(54) SEMICONDUCTOR DEVICE AND METHOD FOR PRODUCING THE SAME

(71) Applicant: Infineon Technologies AG, Neubiberg (DE)

(72) Inventors: Jochen Hilsenbeck, Villach (AT); Jens Peter Konrath, Villach (AT); Stefan Krivec, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/532,129

(22) Filed: Nov. 4, 2014

(65) Prior Publication Data

US 2015/0123149 A1    May 7, 2015

Related U.S. Application Data

(63) Continuation-in-part of application No. 14/071,076, filed on Nov. 4, 2013.

(51) Int. Cl.
*H01L 23/532* (2006.01)
*H01L 21/3213* (2006.01)
(Continued)

(52) U.S. Cl.
CPC .... *H01L 21/32133* (2013.01); *H01L 21/2855* (2013.01); *H01L 21/76843* (2013.01); *H01L 21/76852* (2013.01); *H01L 24/05* (2013.01); *H01L 29/1066* (2013.01); *H01L 29/41766* (2013.01); *H01L 29/8083* (2013.01); *H01L 23/53238* (2013.01); *H01L 29/1608* (2013.01); *H01L 29/2003* (2013.01); *H01L 2224/022* (2013.01); *H01L 2224/04042* (2013.01); *H01L 2224/05547* (2013.01); *H01L 2224/05647* (2013.01); *H01L 2224/85375* (2013.01);
(Continued)

(58) Field of Classification Search
CPC .................. H01L 2924/00; H01L 2924/0002
USPC .......................... 257/E21.415, 758; 136/256
See application file for complete search history.

(56) References Cited

U.S. PATENT DOCUMENTS 6,103,609 A * 8/2000 Lee ................... H01L 21/28044
257/E21.198
7,969,006 B2 * 6/2011 Lin ................... H01L 21/76816
257/758

(Continued)

FOREIGN PATENT DOCUMENTS

CN          103094231 A       5/2013

*Primary Examiner* — David Vu
*Assistant Examiner* — Jonathan Han
(74) *Attorney, Agent, or Firm* — Murphy, Bilak & Homiller, PLLC

(57) ABSTRACT

A semiconductor device comprises a semiconductor body with a front face and a back face, having an active zone located at the front face, a front surface metallization layer having a front face and a back face directed towards the active zone, the front surface metallization layer being provided on the front face of the semiconductor body and being electrically connected to the active zone, and a first barrier layer, comprising amorphous metal nitride, located between the active zone and the metallization layer. Further, a method for producing such a device is provided.

29 Claims, 5 Drawing Sheets

(51) Int. Cl.
*H01L 21/285* (2006.01)
*H01L 21/768* (2006.01)
*H01L 29/808* (2006.01)
*H01L 29/417* (2006.01)
*H01L 29/10* (2006.01)
*H01L 23/00* (2006.01)
H01L 29/16 (2006.01)
H01L 29/20 (2006.01)

(52) U.S. Cl.
CPC ............... *H01L 2924/12036* (2013.01); *H01L 2924/13055* (2013.01); *H01L 2924/13091* (2013.01)

(56) References Cited

U.S. PATENT DOCUMENTS

| | | | | |
|---|---|---|---|---|
| 2007/0048992 A1* | 3/2007 | Hosokawa | ............ | C23C 14/566 438/597 |
| 2008/0254232 A1* | 10/2008 | Gordon | ................ | C07C 211/65 427/585 |
| 2013/0234148 A1* | 9/2013 | Werkhoven | ............. | H01L 29/20 257/76 |

* cited by examiner

SEMICONDUCTOR DEVICE AND METHOD FOR PRODUCING THE SAME

TECHNICAL FIELD

This specification refers to embodiments of methods for forming a semiconductor device. Furthermore, this specification refers to embodiments of semiconductor devices, for example IGBTs, DMOS, Bipolartransistors, IGBTs, Diodes, or Thyristors with an improved barrier layer.

BACKGROUND

For improving the stability in case of short circuit and for increasing the load change performance of, e.g., IGBTs, there has been a tendency to replace the well-known metallization using aluminium (AlSi or AlSiCu) with a thick Cu metallization in the regime of 5 μm to 20 μm. This shall provide a higher performance, enabling higher operating temperatures due to enhanced heat dissipation.

However, the application of Cu as a metallization bears some drawbacks. For example, Cu reacts with Si at temperatures as low as room temperature and results in Cu silizides. As an example, $Cu_3Si$ forms at room temperature. Hence, a barrier between the Cu metallization and the Si is required. Typically, a barrier layer of a material with a high melting point is provided, such as W, Ta, or an alloy such as TiW or TiN. Frequently, combinations of various layers employing different elements are used.

Furthermore, Cu atoms tend to diffuse into Si and can thus drastically reduce the life time of minority charge carriers. This may lead to various drawbacks, for example an undesirable enhancement of the forward voltage and the leaking current in a blocking state.

Furthermore, in a humid atmosphere, an electrochemical reaction in the presence of an electric field can lead to a discharge of Cu ions. These are produced by anodic oxidation, may start wandering due to the presence of the electrical field during operation and may under certain circumstances accumulate at the cathode, whereby Cu dendrites are formed, which is also known as electro migration. The latter process occurs primarily in the region of the edge termination, because in this region a higher electric field is present. During the drift process towards the edge region, the positively charged Cu ions may disturb the well-defined change of potential.

However, known barrier layers employing materials like TiW provide at least microscopic paths along microscopic crystal boundaries, through which Cu atoms may unwantedly diffuse from the metallization layer towards the active area, causing negative effects as described.

For these and other reasons there is a need for the present invention.

SUMMARY

In a first aspect, a semiconductor device is provided. It comprises a semiconductor body with a front face and a back face, has an active zone located at the front face, and a front surface metallization layer having a front face and a back face directed towards the active zone. The front surface metallization layer is provided on the front face of the semiconductor body and is electrically connected to the active zone, and a first barrier layer, comprising amorphous metal nitride, is located between the active zone and the metallization layer.

In a further aspect, a method of producing a semiconductor device is provided. The method includes providing a semiconductor body having a front face and a back face, providing an active zone in the semiconductor body partially located at the front face, providing a first barrier layer covering the active zone on a front face of the semiconductor body, the barrier layer comprising amorphous metal nitride, and providing a front surface metallization layer on the first barrier layer.

Thereby, a front surface metallization is delivered, which is encapsulated by a amorphous metal nitride barrier. The barrier prevents, on the one hand, diffusion of the material of the front side metallization into the underlying layers, and also ensures that no oxygen can enter the surface of the front side metal. Thus, uncontrolled oxidation of the front side metal is inhibited.

These and other embodiments are illustrated in the attached drawings and described in detail below. Accordingly, those skilled in the art will recognize additional features and advantages of the present invention upon reading the following detailed description and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
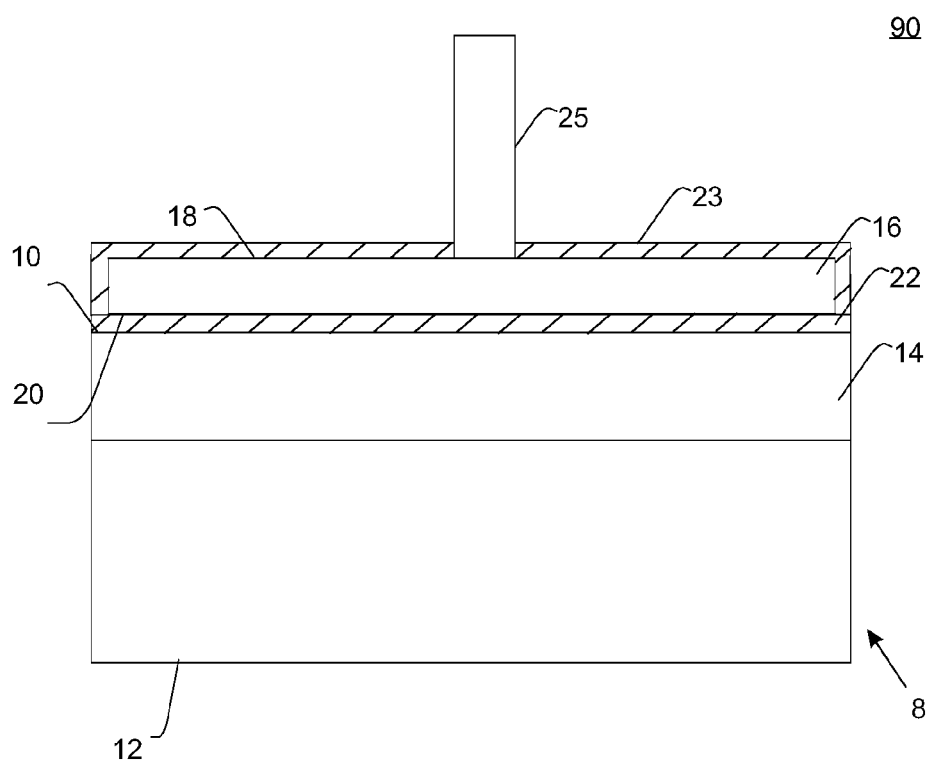
FIG. 1 schematically illustrates a vertical cross-section of a semiconductor device according to one or more embodiments.

In the following Detailed Description, reference is made to the accompanying drawings, which form a part hereof, and in which are shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" or "lateral" as used in this specification intends to describe an orientation substantially parallel to a first or main horizontal surface of a semiconductor substrate or body. This can be, for instance, the surface of a wafer or a die.

The term "vertical" as used in this specification is intended to describe an orientation which is substantially arranged perpendicular to the first surface, i.e., parallel to a normal direction with respect to a lateral surface of a semiconductor substrate or body.

Further, the terms "active zone" and "active region" of a semiconductor device are used interchangeably herein, as well as "passive zone", "passive region", "peripheral zone", "termination region" and "edge termination region".

Further, the term "semi-isolating" as used herein is intended to describe a property of a material which is characterized by a specific electrical resistance of $10^6$ Ω cm or greater, more preferred $10^8$ Ω cm or greater, even more preferred $10^{10}$ Ω cm or greater.

Further, the terms "peripheral zone" and "termination zone" are used interchangeably.

In this specification, an n-doped material or region is referred to as having a first conductivity type, while a p-doped material or region is referred to as having a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n⁻" means a doping concentration that is less than the doping concentration of an "n"-doping region while an "n⁺"-doping region has a larger doping concentration than the "n"-doping region. However, indicating the relative doping concentration does not mean that doping regions of the same relative doping concentration have to have the same absolute doping concentration unless otherwise stated. For example, two different n⁺ regions can have different absolute doping concentrations. The same applies, for example, to an n⁺ and a p⁺ region.

Embodiments described in this specification may pertain to, without being limited thereto, field effect transistors, and in particular pertain to power field effect transistors. The term "field-effect," as used in this specification, is intended to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in ohmic contact with a drain or collector electrode. The source region or emitter region is in ohmic contact with a source or emitter electrode. Without applying an external voltage between the gate electrode and the source or emitter electrode, the ohmic current path between the source or emitter electrode and the drain or collector electrode through the semiconductor device is broken or at least high-ohmic in normally-off field effect devices. In normally-on field effect devices such as HEMTs (High Electron Mobility Transistors), depletion MOSFETs (Metal Oxide Field Effect Transistors) and normally-on JFETs (Junction-FETs), the current path between the source electrode and the drain electrode through the semiconductor device is typically low-ohmic without applying an external voltage between the gate electrode and the source or emitter electrode.

In the context of the present specification, the term "field-effect structure" is intended to describe a structure formed in a semiconductor substrate or semiconductor device having a gate electrode for forming and or shaping a conductive channel in the channel region. The gate electrode is at least insulated from the channel region by a dielectric region or dielectric layer.

The terms "depleted" and "completely depleted" are intended to describe that a semiconductor region comprises substantially no free charge carriers. Typically, insulated field-plates are arranged close to pn-junctions formed, e.g., between a drift region and a body region. Accordingly, the blocking voltage of the pn-junction and the semiconductor device, respectively, may be increased. The dielectric layer or region that insulates the field-plate from the drift region is in the following also referred to a field dielectric layer or field dielectric region. The gate electrode and the field-plate may be on same electrical potential or on different electrical potential. The field-plate may be on source or emitter potential. Furthermore, a portion of the gate electrode may be operated as field electrode.

Examples of dielectric materials for forming a dielectric region or dielectric layer between the gate electrode or a field-plate and the drift region include, without being limited thereto, $SiO_2$, $Si_3N_4$, $SiO_xN_y$, $Al_2O_3$, $ZrO_2$, $Ta_2O_5$, $TiO_2$ and $HfO_2$, as well as mixtures and/or layers or liners of these materials.

Embodiments described herein generally have the aim of reducing the described inherent disadvantages of a metallization on a (non-limiting) semiconductor, e.g. comprising Si, by employing an additional continuous barrier in the active area of the chip and around the front surface metallization layer. To this end, it is proposed to provide a barrier layer comprising amorphous metal nitride, for example amorphous molybdenum nitride. Thereby, the employed amorphous metal nitride should have a sufficient electrical conductivity, that is, roughly in the same order of magnitude as the electrical conductivity of amorphous molybdenum nitride.

A semiconductor device 90 according to embodiments, as shown in FIG. 1, comprises a semiconductor body 8 with a front face 10 and a back face 12, having an active zone 14 located at the front face 10. A front surface metallization layer 16, having a front face 18, and a back face 20 directed towards the active zone 14, is provided on the front face 10 of the semiconductor body 8 and is electrically connected to the active zone 14. A first barrier layer 22, comprising amorphous molybdenum nitride, is located between the active zone 14 and the front surface metallization layer 16. The barrier layers 22, 23 are conductive. A second barrier layer 23 comprising amorphous molybdenum nitride is provided on the front face 18 of the front surface metallization layer 16, typically covering also its side flanks. The front surface metallization layer 16 is encapsulated by the first barrier layer 22 and second barrier layer 23. This encapsulation is typically only open at locations where an electrical connection of the front surface metallization layer 16 with an outside is provided, typically by a bonding wire 25. Generally, as used herein, the term "encapsulated" includes that one or several electrical connection(s), typically bonding wires 25, may lead through the encapsulating second (or upper) barrier layer 23 to or from the front surface metallization layer.

In embodiments, reactive sputtering of molybdenum in a nitrogen/argon atmosphere may be employed for depositing the barrier layers 22, 23, comprising amorphous molybdenum nitride. Appropriate process conditions for the deposition of barrier layers, or amorphous molybdenum nitride layers, according to embodiments are laid out in the following, wherein the stoichiometry depends on the exact conditions during the deposition. A gas mixture according to embodiments, such as:

$$N_2/(Ar+N_2) \text{ ratio of } >0.5 \tag{1}$$

will result in the deposition of amorphous molybdenum nitride layers showing no grain boundaries inherently, which is desirable. These layers can be used as molybdenum nitride with stoichiometry Mo:N 1:1, or occur as a mixed phase of the former compound with $Mo_2N$.

Amorphous layers of $Mo_2N$ may in embodiments, in non-limiting examples, be obtained by:

$$N_2/(Ar+N_2) \text{ ratio of } 0.15<x<0.5 \tag{2}$$

typically at a sputtering pressure of >10 mTorr.

Due to the amorphous nature of the layers described in (1) and (2) according to embodiments, the presence of grain boundaries is avoided. It goes without saying that also other process conditions leading to a deposition of amorphous molybdenum nitride layers are regarded to be included by this disclosure. Increased impermeability (in the direction towards the active semiconductor region) results over conventional diffusion barriers against both Cu and other materials commonly used as front side metallization metals and alloys, such as AlCu or AlSiCu, as well as to oxygen and moisture exposition of the outer surface of the front side metallization layer. Moreover, the molybdenum nitride layers according to embodiments provide, due to their low electrical resistivity, a good electrical connection of the active semiconductor region and its environment, such as a module or discrete package. Thus, with only one material system, molybdenum nitride, a number of weaknesses of previous barrier techniques can be overcome, which leads at the same time to a simplification of the production process.

The first and second barrier layers 22, 23 may have a typical thickness from about 100 nm to about 2 μm, more typically from about 200 nm to about 800 nm. In some embodiments, the semiconductor device may comprise SiC. It may be any type of semiconductor device, such as, for example, a IGBT, a FET, a diode, a BJT, and a Thyristor. In embodiments, semiconductor materials such as SiC, Si, (Al)GaN, and GaAs can be employed. Generally, in embodiments the first barrier layer and the second barrier layer may comprise amorphous metal nitride, wherein, as a non-limiting example only, barrier layers comprising amorphous molybdenum nitride are described herein in greater detail.

A method of producing a semiconductor device according to embodiments comprises providing a semiconductor body having a front face and a back face, providing an active zone in the semiconductor body partially located at the front face, and providing a first barrier layer covering the active zone on a front face of the semiconductor body, the barrier layer comprising amorphous metal nitride. A front surface metallization layer is provided on the first barrier layer.

An exemplary method according to embodiments is shown in detail with respect to FIG. 2 to FIG. 7. Thereby, semiconductor device 100 is exemplarily and non-limiting a JFET transistor or transistor array, using SiC as a semiconductor material. It goes without saying that the disclosed methods and concepts can be applied to many types of semiconductor devices.

Figure 2:
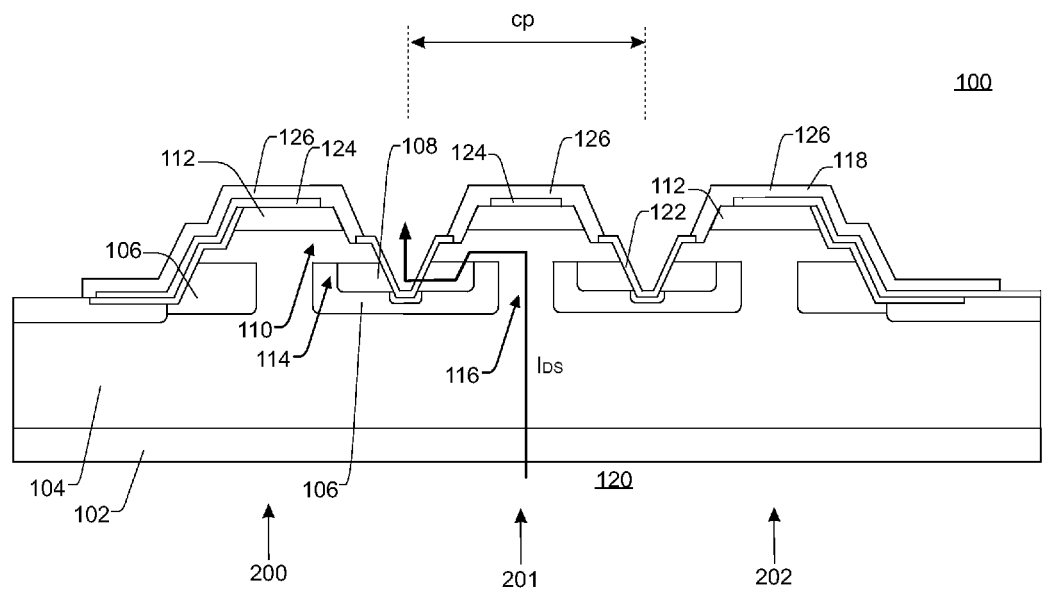
FIG. 2 schematically illustrates a vertical cross-section of an intermediate product of a semiconductor device according to one or more embodiments.

The illustrated semiconductor device 100 in FIG. 2 is shown and described as including one or more transistor "cells" 200, 201, 202. The device in FIG. 2 represents an intermediate product in a production of a device according to embodiments, which will be described with respect to the Figures in the following. The intermediate product device 100 is a transistor structure with JFETs, which is basically produced according to known methods.

A transistor cell 200, 201, 202 may include one or more transistor devices, depending on the components included in the cell. An example cell is shown bounded by dashed lines that describe the pitch cp of an example cell (from one source contact 122 to the next source contact 122, for example). A transistor structure of semiconductor device 100 may contain one cell or multiple cells. In some implementations, multiple cells may be used together in a transistor structure 100 to minimize cost and die area while maximizing the channel density of the transistor structure 100. In various implementations, a transistor structure 100 may be comprised of multiple cells that are arranged in rows, matrices, and the like. Accordingly, cells may have various shapes, including strips, polygons, and so forth. In some implementations, cells may have irregular shapes. In various implementations, a transistor device included in a cell may include a substrate layer 102, a drift region 104 (also referred to as a mass, bulk, etc.), a well region, (also called body or buried gate) 106, a source region 108, a channel region 110, a top gate 112, a back gate 114, a current flow region 116 of the drift region 104, one or more metallization layers 118, a drain region 120, a source contact 122, a gate contact 124, and the like. In alternate implementations, a semiconductor device may include alternate or additional components, or may have different boundaries.

In various implementations, many of the components of a transistor structure 100 may be comprised of a p-type or an n-type semiconductor material, for example. In the implementations, the source region 108, channel region 110, drift region 104, and the substrate 102 may be comprised of the same type of semiconductor material (possibly at different doping levels). The top gate 112 and back gate 106 may be comprised of an opposite type of semiconductor material (possibly at different doping levels). The semiconductor materials may, for example, include regions of silicon, germanium, silicon carbide, gallium nitride, or another material having semiconducting properties.

Typically, the source contact 122 and the gate contact 124 are of a conductive material, such as a metal, for example. In the implementation, as shown in FIG. 2, the transistor cell 200, 201, 202 include an insulating layer 126 overlying the top gates 112 and the gate contacts 124. Typically, the insulating layer 126 may cover the top components of the transistor cells 200, 201, 202. In various implementations, the insulating layer 126 is comprised of an insulating material, such as a silicon-oxide, silicon dioxide, silicon oxynitride, or some other material which is electrically insulating. The source contact 122 is typically not covered by the insulating layer 126, though, for example its end regions may be covered such as exemplarily shown in FIG. 2.

Figure 3:
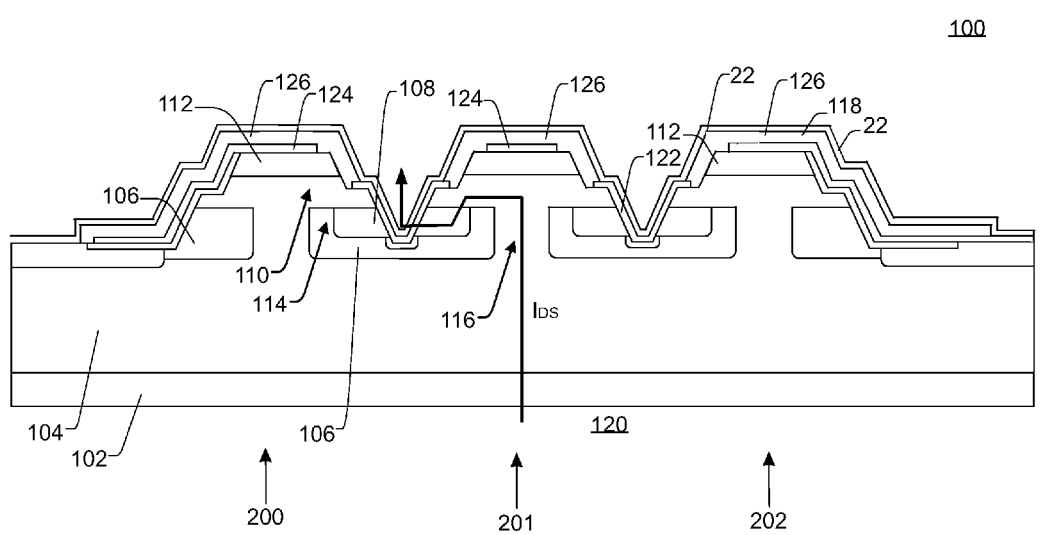
FIG. 3 schematically illustrates a vertical cross-section of a further intermediate product of a semiconductor devices according to one or more embodiments.

In FIG. 3, a further intermediate product of device 100 is shown. After etching vias into insulating layer 126, typically an oxide layer, for contacting the source contacts 122 and the gate pads 112, the first barrier layer 22 comprising molybdenum nitride is deposited as described before via sputtering, leading to a continuous conductive first barrier layer 22 on the top of intermediate semiconductor device 100, above the active zone of the cells 200, 201, 202.

Figure 4:
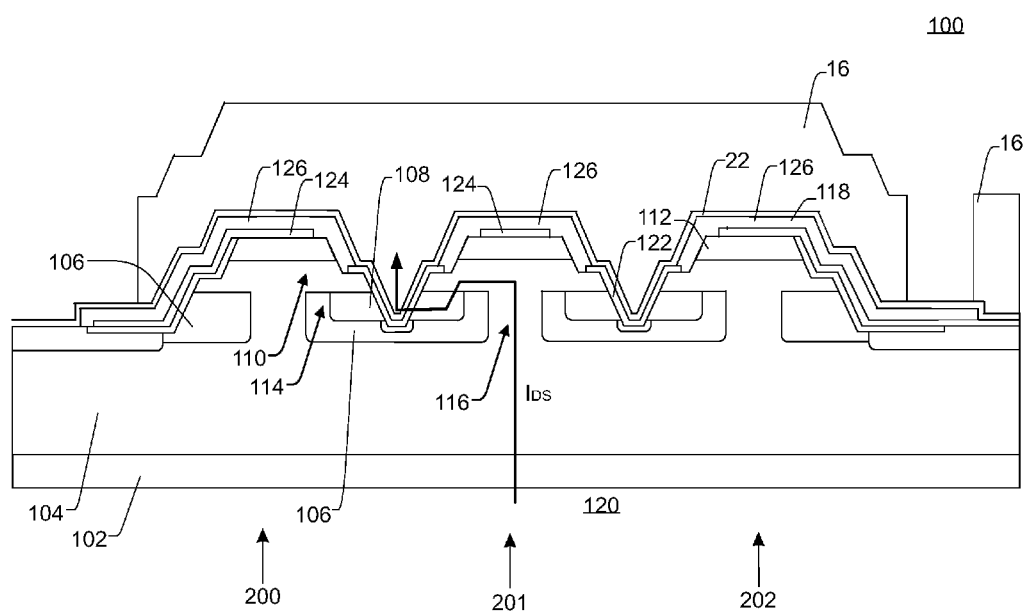
FIG. 4 schematically illustrates a vertical cross-section of a yet further intermediate product of a semiconductor device according to one or more embodiments.

Subsequently, the front side metallization layer 16, in the example of Cu, is deposited insitu, the state after which is shown in FIG. 4, wherein the Cu front side metallization layer 16 has already been structured. This may for example be carried out using a mask and wet etching. Care should be taken that the side flanks of the Cu front side metallization layer do not exceed a certain ramp angle, which might have negative effects on the coverage achieved by the subsequent deposition of the second barrier layer 23.

Figure 5:
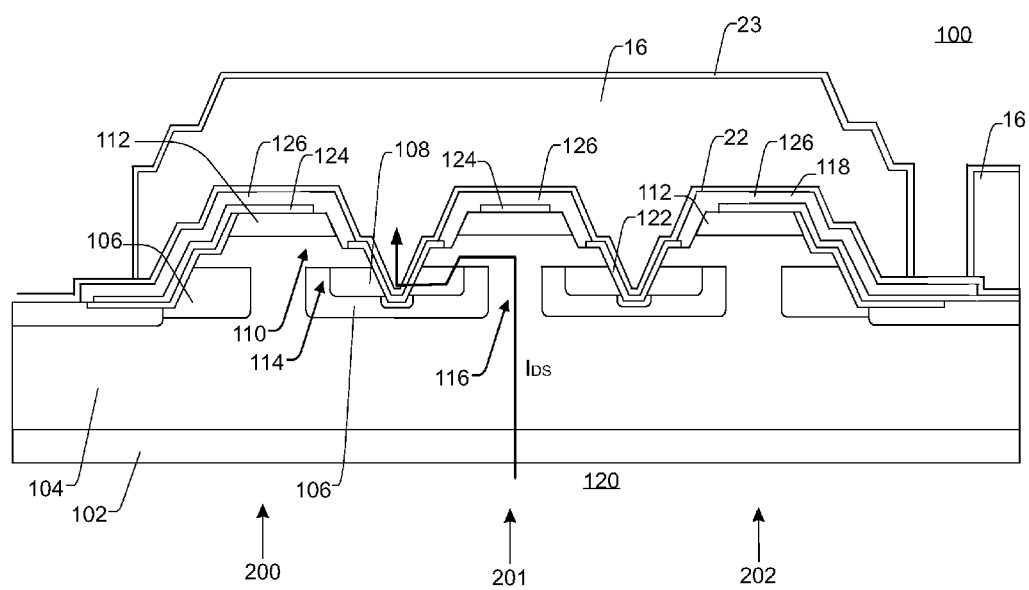
FIG. 5 schematically illustrates a vertical cross-section of a further intermediate product of a semiconductor device according to one or more embodiments.
Figure 6:
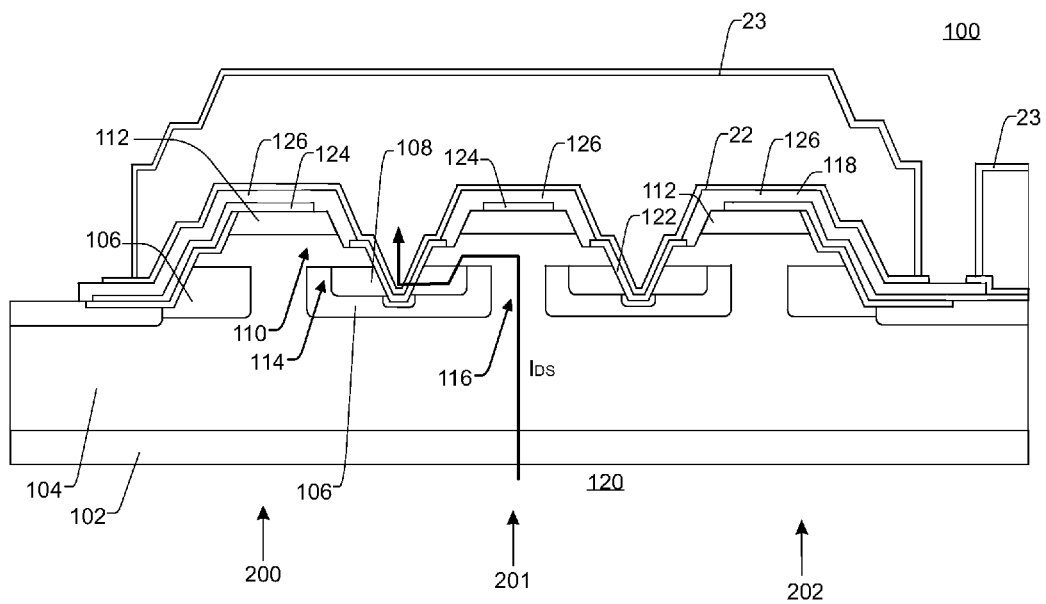
FIG. 6 schematically illustrates a vertical cross-section of a yet further intermediate product of a semiconductor device according to one or more embodiments.

Generally, care must be taken that the barrier layers 22, 23 are of sufficient thickness to achieve the aimed barrier effect. On the other hand, the second barrier layer 23, which is shown in FIG. 5, must not bee too thick, because it will in a later, subsequent step be pinched in a bonding step. After the deposition of second barrier layer 23, both the first and the second barrier layers 22, 23 are structured employing a further photoresist mask (not shown). This structuring may in embodiments be achieved by dry or wet etching. The intermediate device 100 after the structuring step is shown in FIG. 6.

Figure 7:
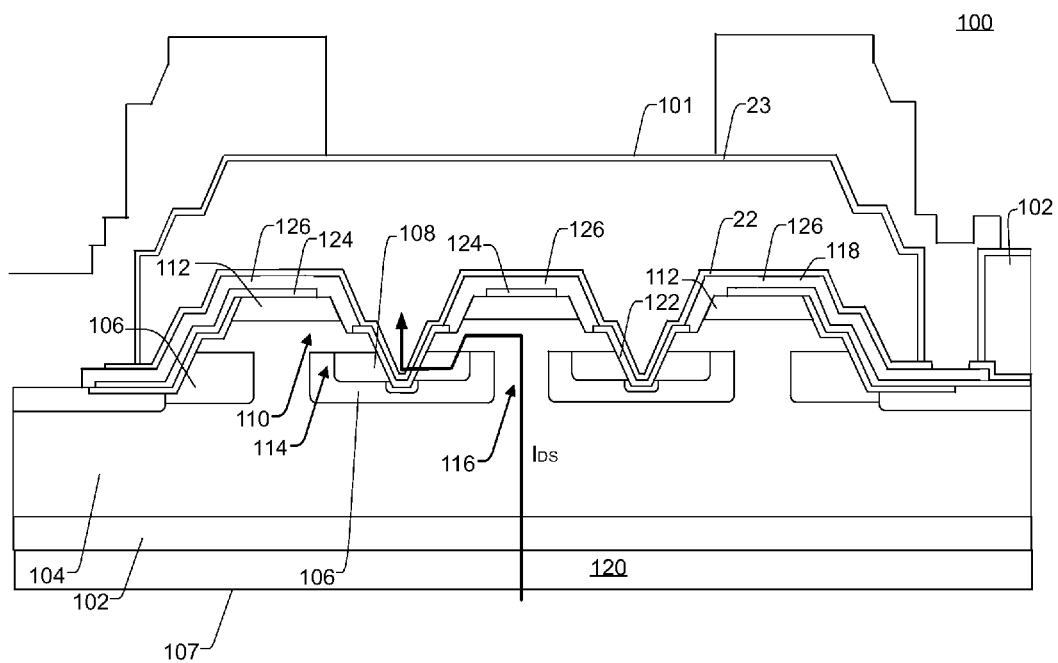
FIG. 7 schematically illustrates a vertical cross-section of a semiconductor device according to one or more embodiments.

Subsequently, the front side is passivated. This may, for example, be achieved by applying photoimide, or by a hard passivation (via silicon oxide or -nitride). After the passivation, in the pad areas (source pad 101, gate pad 102) the passivation has to be removed again. Subsequently, in a backside process the backside of the device 100 is thinned, and a backside contact 107 metallization for drain contact 120 is applied. The semiconductor device 100 after these steps is shown in FIG. 7. The source pad 101 and the gate pad 102 are then contacted by bonding wires, whereby the wires are bonded through the molybdenum nitride barrier layer. The parameters of the bonding process are adapted accordingly.

Figure 8:
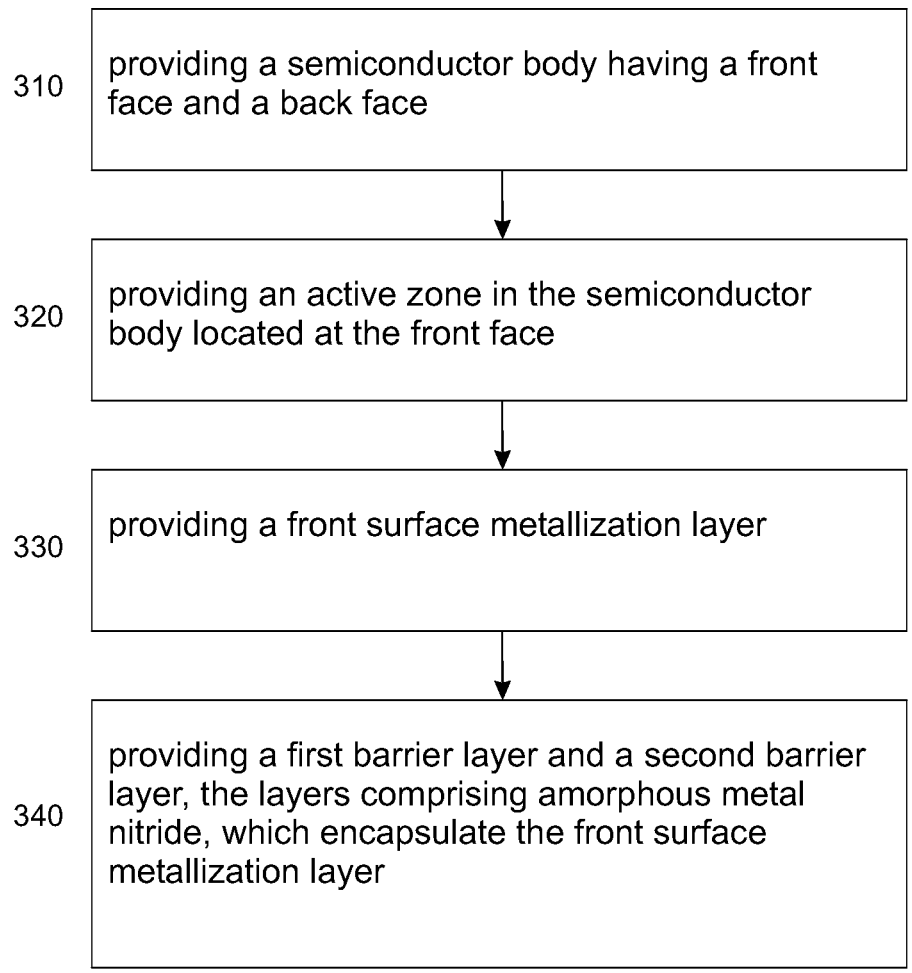
FIG. 8 schematically illustrates a method according to embodiments.

In FIG. 8, a method 300 of producing a semiconductor device 90, 100 according to embodiments is schematically shown. The method comprises providing a semiconductor body having a front face and a back face in a block 310, providing an active zone in the semiconductor body located at the front face in a block 320, providing a front surface metallization layer in a block 330, and providing a first barrier layer and a second barrier layer, the layers comprising molybdenum nitride, which encapsulate the front surface metallization layer, in a block 340.

While in the embodiments described with respect to FIG. 2 to FIG. 7, the semiconductor device 100 is a JFET, the device may in embodiments be any semiconductor device having a pn junction (active region) in the vicinity of a surface. In particular, it may be a IGBT, a FET, a thyristor, a GTO, a JFET, a MOSFET, a compensation MOSFET, a BJT, a diode, and a HEMT.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A semiconductor device, comprising:
    a semiconductor body with a front face and a back face, having an active zone located at the front face;
    a front surface metallization layer having a front face and a back face directed towards the active zone, the front surface metallization layer being provided on the front face of the semiconductor body and being electrically connected to the active zone;
    a first barrier layer, comprising amorphous metal nitride, located between the active zone and the front surface metallization layer; and
    a second barrier layer, comprising amorphous metal nitride, provided on the front face of the front surface metallization layer,
    wherein the first barrier layer contacts the front face of the semiconductor body or a contact at the front face of the semiconductor body at a first side of the first barrier layer and contacts the back face of the front surface metallization layer at a second side of the first barrier layer opposite the first side.

2. The device of claim 1, wherein the amorphous metal nitride comprises amorphous molybdenum nitride.

3. The device of claim 1, wherein the first and second barrier layer encapsulate the front surface metallization layer.

4. The device of claim 1, the first and second barrier layers have a thickness from about 100 nm to about 2 μm.

5. The device of claim 1, wherein the semiconductor device comprises SiC, Si, (Al)GaN, GaAs.

6. The device of claim 1, wherein the semiconductor element is one of a IGBT, a FET, a diode, a BJT, and a thyristor.

7. The device of claim 1, wherein the front surface metallization layer comprises Cu, Au, Pt, or Fe.

8. A method of producing a semiconductor device, comprising:
    providing a semiconductor body having a front face and a back face;
    providing an active zone in the semiconductor body located at the front face;

providing a first barrier layer covering the active zone on a front face of the semiconductor body, the first barrier layer comprising amorphous metal nitride and contacting the front face of the semiconductor body or a contact at the front face of the semiconductor body at a first side of the first barrier layer; and providing a front surface metallization layer on the first barrier layer, the first barrier layer contacting the front surface metallization layer at a second side of the first barrier layer opposite the first side.

9. The method of claim 8, wherein the amorphous metal nitride comprises amorphous molybdenum nitride.

10. The method of claim 8, further comprising:
providing a second barrier layer comprising amorphous metal nitride on a front face of the front surface metallization layer.

11. The method of claim 10, wherein the front surface metallization layer is encapsulated by the first barrier layer and the second barrier layer.

12. The method of claim 10, wherein the first and second barrier layers have a thickness from about 100 nm to about 2 μm.

13. The method of claim 10, wherein the front surface metallization layer is structured prior to the provision of the second barrier layer.

14. The method of claim 13, wherein the structuring is carried out by chemical etching.

15. The method of claim 10, wherein the first and second barrier layers are provided by PECVD.

16. The method of claim 10, further comprising providing a protecting polyimide layer on the second barrier layer.

17. The method of claim 8, wherein the semiconductor device comprises SiC, Si, GaAs, (Al)GaN.

18. The method of claim 8, wherein the semiconductor element is one of a IGBT, a FET, and a diode, a BJT, and a thyristor.

19. The method of claim 8, wherein the front surface metallization layer comprises at least one of Cu, Au, Pt, and Fe.

20. A semiconductor comprising:
a semiconductor body with a front face and a back face, having an active zone located at the front face;
a front surface metallization layer having a front face and a back face directed towards the active zone, the front surface metallization layer being provided on the front face of the semiconductor body and being electrically connected to the active zone; and
a first barrier layer and a second barrier layer, the layers comprising amorphous metal nitride, wherein the first and second barrier layer encapsulate the front surface metallization layer,
wherein the first barrier layer contacts the front face of the semiconductor body or a contact at the front face of the semiconductor body at a first side of the first barrier layer and contacts the back face of the front surface metallization layer at a second side of the first barrier layer opposite the first side.

21. The semiconductor device of claim 20, wherein the amorphous metal nitride comprises amorphous molybdenum nitride.

22. The device of claim 20, wherein the first and second barrier layers have a thickness from about 100 nm to about 2 μm.

23. The device of claim 20, comprising SiC, Si, (Al)GaN, or GaAs.

24. The device of claim 20, wherein the semiconductor device is one of a IGBT, a FET, a diode, a BJT, and a thyristor.

25. The device of claim 20, wherein the front surface metallization layer comprises Cu, Au, Pt, or Fe.

26. A method of producing a semiconductor device, comprising:
providing a semiconductor body having a front face and a back face;
providing an active zone in the semiconductor body located at the front face;
providing a front surface metallization layer; and
providing a first barrier layer and a second barrier layer, both comprising amorphous metal nitride, which encapsulate the front surface metallization layer, the first barrier layer contacting the front face of the semiconductor body or a contact at the front face of the semiconductor body at a first side of the first barrier layer and contacting the front surface metallization layer at a second side of the first barrier layer opposite the first side.

27. The method of claim 26, wherein the amorphous metal nitride comprises amorphous molybdenum nitride.

28. The method of claim 26, wherein the barrier layers are provided by reactive sputtering.

29. The method of claim 26, wherein the front surface metallization layer comprises Cu, Au, Pt, or Fe.

* * * * *

UNITED STATES PATENT AND TRADEMARK OFFICE
CERTIFICATE OF CORRECTION

| | | |
|---|---|---|
| PATENT NO. | : 9,685,347 B2 | |
| APPLICATION NO. | : 14/532129 | |
| DATED | : June 20, 2017 | |
| INVENTOR(S) | : J. Hilsenbeck et al. | |

It is certified that error appears in the above-identified patent and that said Letters Patent is hereby corrected as shown below:

In the Claims

Column 9, Line 40 (Claim 20, Line 1), please change "semiconductor" to -- semiconductor device, --.

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*